United States Patent
Brown et al.

(10) Patent No.: US 10,174,211 B2
(45) Date of Patent: Jan. 8, 2019

(54) CONDUCTIVE PASTE WITH IMPROVED PERFORMANCE IN GLASS STRENGTH

(71) Applicant: Ferro Corporation, Mayfield Heights, OH (US)

(72) Inventors: Terry J. Brown, Pittsburgh, PA (US); Jeffrey Grover, Bethel Park, PA (US); David Klimas, Pittsburgh, PA (US); George E. Sakoske, Independence, OH (US)

(73) Assignee: Ferro Corporation, Mayfield Heights, OH (US)

( * ) Notice: Subject to any disclaimer, the term of this patent is extended or adjusted under 35 U.S.C. 154(b) by 95 days.

(21) Appl. No.: 15/126,674

(22) PCT Filed: Feb. 6, 2015

(86) PCT No.: PCT/US2015/014753
§ 371 (c)(1),
(2) Date: Sep. 16, 2016

(87) PCT Pub. No.: WO2015/152994
PCT Pub. Date: Oct. 8, 2015

(65) Prior Publication Data
US 2017/0088718 A1  Mar. 30, 2017

Related U.S. Application Data

(60) Provisional application No. 61/974,006, filed on Apr. 2, 2014.

(51) Int. Cl.
| | |
|---|---|
| *C09D 5/24* | (2006.01) |
| *H01B 1/16* | (2006.01) |
| *C03C 8/18* | (2006.01) |
| *C03C 8/04* | (2006.01) |
| *C03C 3/089* | (2006.01) |
| *C03C 3/066* | (2006.01) |
| *C03C 4/14* | (2006.01) |
| *C03C 17/04* | (2006.01) |
| *H01L 31/0224* | (2006.01) |

(52) U.S. Cl.
CPC ............. *C09D 5/24* (2013.01); *C03C 3/066* (2013.01); *C03C 3/089* (2013.01); *C03C 4/14* (2013.01); *C03C 8/04* (2013.01); *C03C 8/18* (2013.01); *C03C 17/04* (2013.01); *H01B 1/16* (2013.01); *C03C 2204/00* (2013.01); *C03C 2205/00* (2013.01); *C03C 2217/479* (2013.01); *C03C 2217/485* (2013.01); *C03C 2217/70* (2013.01); *H01L 31/022425* (2013.01)

(58) Field of Classification Search
CPC ... H01B 1/14; H01B 1/16; C09D 5/24; B05D 5/06; B05D 5/067
See application file for complete search history.

(56) References Cited

U.S. PATENT DOCUMENTS

| | | |
|---|---|---|
| 5,011,627 A | 4/1991 | Lutz et al. |
| 5,141,798 A | 8/1992 | Chaumonot et al. |
| 5,334,412 A | 8/1994 | Korn et al. |
| 5,346,651 A | 9/1994 | Oprosky et al. |
| 5,422,190 A | 6/1995 | Alexander |
| 5,798,468 A | 8/1998 | Weise et al. |
| 6,517,931 B1 | 2/2003 | Fu |
| 6,531,181 B1 | 3/2003 | Niemann et al. |
| 6,558,746 B2 | 5/2003 | Starz et al. |
| 6,814,795 B2 | 11/2004 | McVicker et al. |
| 7,201,888 B2 | 4/2007 | Berube et al. |
| 7,833,439 B2 | 11/2010 | Brown et al. |
| 8,772,189 B2 | 7/2014 | Singh et al. |
| 9,082,899 B2 | 7/2015 | Jiang et al. |
| 9,275,772 B2 | 3/2016 | Pham et al. |
| 9,565,772 B2 | 2/2017 | Sakoske et al. |
| 2008/0206553 A1 | 8/2008 | Schneider et al. |
| 2010/0163101 A1 | 7/2010 | Kumar et al. |
| 2014/0220363 A1* | 8/2014 | Garcia ............... H01B 1/22 428/433 |

OTHER PUBLICATIONS

Machine translation of RU2024081 dated Jun. 23, 2015, ten pages.
International Search Report for corresponding PCT/US2015/014753 dated May 28, 2015, one page.

* cited by examiner

*Primary Examiner* — Haidung D Nguyen

(74) *Attorney, Agent, or Firm* — Rankin, Hill & Clark LLP

(57) ABSTRACT

Silver pastes including two powders having different physical properties and silver flakes together with glass frits and pigments impart improved thermal stress characteristics to substrates upon firing.

20 Claims, No Drawings

CONDUCTIVE PASTE WITH IMPROVED PERFORMANCE IN GLASS STRENGTH

BACKGROUND OF THE INVENTION

1. Field of Invention

The invention relates to silver pastes demonstrating comparable thermal coefficient properties relative to glass substrates to which they are applied.

This invention relates to a conductive silver paste which, when applied during the thermal fusing (firing) of the paste to a glass, silicon, ceramic or ceramic glass enamel substrate, provides conductivity and a thermal coefficient similar to the substrate, thus reducing transient thermal stress differences from developing between the coating and aforementioned substrates, that would otherwise occur. The paste includes lower density silver powder, high density silver powder, and medium density silver flake, together with black pigment and a combination of lower expansion glass frits, having different melting temperatures. The glass fits are, and hence, the paste is, lithium free.

In particular, the present invention relates to a conductive silver coating that includes a combination of lower expansion glass frits having melting temperatures over a relatively wide range, enabling the silver to produce less stress on the fired substrate and increase over ties over an extended temperature range, thus reducing thermal stress differences from developing between the coating and the aforementioned substrates, that would otherwise occur, especially if the firing cycle time is shortened.

2. Description of Related Art

Conventional conductive silver pastes are made with a low melting fit which may contain oxides of lead, cadmium, lithium, bismuth, zinc, boron and/or silica. The conductive pastes are printed onto glass or ceramic substrates and fired to sinter and bond the conductive paste to the substrate. Application of any type of fired coating onto a glass substrate will weaken the glass substrate.

BRIEF DESCRIPTION OF THE INVENTION

Accordingly, the art requires a conductive paste, which, when applied and fired to a glass or ceramic substrate, does not weaken the glass substrate, or at least weakens it to a lesser extent than known conductive pastes. The invention overcomes the drawbacks of the prior art as demonstrated hereinbelow.

An embodiment of the invention is a silver-containing paste that imparts improved strength to a substrate upon which it is applied and fired.

An embodiment of the invention is a silver-containing paste that imparts improved strength to a substrate upon which it is applied and fired.

An embodiment of the invention is a silver-containing paste that reduces transient thermal stresses during firing, to a substrate upon which it is applied and fired.

An embodiment of the invention is a conductive paste including a silver component including first and second silver pastes having different tap densities, and silver flakes. The paste includes a glass component including at least one frit selected from the group consisting of $Bi_2O_3$, ZnO, $SiO_2$, $B_2O_3$, $Na_2O$, $K_2O$ and $ZrO_2$. The paste may also include an oxide pigment including oxygen and at least one of copper, chrome, and iron.

An embodiment of the invention is a device including a substrate to which a silver-containing paste is applied and fired, wherein the presence of the paste during firing reduces transient thermal stresses during firing, to the substrate upon which it is applied and fired.

An embodiment of the invention is a conductive paste comprising: (a) 50-90 wt % of a silver component, comprising (i) 10-55 wt % of a first silver powder having a tap density of 0.3-1.5 g/cc, (ii) 10-35 wt % of a silver flake having a tap density of 3.0-4.5 g/cc, and (iii) 5-30 wt % of a second silver powder having a tap density of 2.0-4.5 g/cc, (b) 2-10 wt % of a glass component, comprising (i) 25-50 wt % $Bi_2O_3$, (ii) 2-15 wt % ZnO, (iii) 15-45 wt % $SiO_2$, (iv) 5-20 wt % $B_2O_3$, (v) 1-10 wt % $Na_2O+K_2O$ and (vi) 0.1-10 wt % $ZrO_2$ (c) 0.1-2 wt % of a pigment selected from the group consisting of (i) $CuCr_2O_4$, (ii) $(Co,Fe)(Fe,Cr)_2O_4$, and (iii) $(Fe,Co)Fe_2O_4$. Alternate embodiments of the conductive paste include the foregoing ingredients plus (d) 1-8 wt % of at least one organic binder, and (e) 8-40 wt % of at least one organic solvent. Alternate embodiments include conductive pastes including any silver powders, flakes, glass components, pigments, organic binders and organic solvents disclosed elsewhere herein in the amounts elsewhere disclosed.

A further embodiment of the invention is a conductive paste comprising: (a) 55-85 wt % of a silver component, comprising (i) 15-30 wt % silver powder having a tap density of 0.4-1.2 g/cc and a particle size $D_{50}$ of 2.5-6.5 microns, (ii) 15-30 wt % of a silver flake having a tap density of 3.2-4.2 g/cc and a particle size $D_{50}$ of 1.3-3.3 microns, and (iii) 10-28 wt % of a silver powder having a tap density of 2.6-4.3 g/cc and a particle size $D_{50}$ of 1-2 microns, (b) 3-8 wt % of a glass component, comprising (i) 25-50 wt % $Bi_2O_3$, (ii) 2-15 wt % ZnO, (iii) 15-45 wt % $SiO_2$, (iv) 5-20 wt % $B_2O_3$, (v) 1-10 wt % $Na_2O+K_2O$ and (vi) 0.1-10 wt % $ZrO_2$, (c) 1-2 wt % of a pigment selected from the group consisting of (i) $CuCr_2O_4$, (ii) $(Co,Fe)(Fe,Cr)_2O_4$, and (iii) $(Fe,Co)Fe_2O_4$. Alternate embodiments include the foregoing ingredients plus (d) 1-8 wt % of at least one organic binder, and (e) 8-40 wt % of at least one organic solvent.

An embodiment of the invention is a substrate at least partially covered with a fired paste, wherein the paste is any conductive paste disclosed herein.

An embodiment of the invention is a method of reducing transient thermal stresses comprising applying any conductive paste disclosed herein to a substrate and firing the paste to sinter the metals, i.e., silver, and fuse the glass component or glass frits such that a conductive trace including silver metal and fused glass is firmly affixed and integrated with the substrate.

An embodiment of the invention is a method of reducing transient thermal stresses between a coating and a substrate during firing, the method comprising: (a) applying to the substrate a lithium-free conductive paste, the paste comprising: (i) 50-90 wt % of a silver component, comprising: (1) 10-55 wt % of a first silver powder having a tap density of 0.3-1.5 g/cc, (2) 10-35 wt % of a silver flake having a tap density of 3.0-4.5 g/cc, and (3) 5-30 wt % of a second silver powder having a tap density of 2.0-4.5 g/cc, (ii) 2-10 wt % of a glass component, comprising: (1) 25-50 wt % $Bi_2O_3$, (2) 2-15 wt % ZnO, (3) 15-45 wt % $SiO_2$, (4) 5-20 wt % $B_2O_3$, (5) 1-10 wt % $Na_2O+K_2O$ and (6) 0.1-10 wt % $ZrO_2$ (iii) 0.1-5 wt % of a pigment selected from the group consisting of (1) $CuCr_2O_4$, (2) $(Co,Fe)(Fe,Cr)_2O_4$, and (3) $(Fe,Co)Fe_2O_4$, and (b) firing the paste at a firing temperature and time sufficient to sinter the silver metal and fuse the glass component. Alternate embodiments of the method of reducing transient thermal stress include applying the paste including the aforementioned ingredients plus (d) 1-8 wt % of at least one organic binder, and (e) 8-40 wt % of at least one organic solvent. Further alternate embodiments include the method involving conductive pastes including any silver powders, flakes, glass components, pigments, organic binders and organic solvents disclosed elsewhere herein in the amounts elsewhere disclosed. Further alternate embodiments of the method include firing at a firing temperature of about 950° F. to about 1400° F., preferably about 1200° F. to about 1300° F., more preferably about 1200° F. to about 1250° F. Further alternate embodiments of the method include firing at a firing time of about 1 to about 6000 seconds, preferably about 1 to about 600 seconds, more preferably about 1 to about 300 seconds, still more preferably about 1 to about 180 seconds, more preferably about 1 to about 150 seconds, still more preferably about 60 to about 150 seconds.

The invention also includes an automotive glass, a solar cell, and a home appliance including a coating comprising any paste disclosed elsewhere herein, or including a coated substrate made at least in part by any method disclosed elsewhere herein.

The foregoing and other features of the invention are hereinafter more fully described and particularly pointed out in the claims, the following description setting forth in detail certain illustrative embodiments of the invention, these being indicative, however, of but a few of the various ways in which the principles of the invention may be employed.

DETAILED DESCRIPTION OF THE INVENTION

Based on the foregoing, the current art lacks a conductive silver coating that can adequately fuse while minimizing the thermal differences between the silver coating and the substrates of interest (glass, silicon, ceramic, or ceramic enamel) during short firing cycles and firing cycles requiring increased firing temperatures, i.e., above about 1100° F. The invention permits conductive coatings to be made with a wider range of frits, including those based on the borosilicates of zinc, bismuth, and combinations thereof, and hence allows a wider firing range. The silver coatings of the invention allow firing over wide temperature ranges while ensuring good adhesion to the substrates, without subjecting the assembly to increased thermal stresses. The fusion temperature range of the glass fit and melting temperatures of inorganic pigments and compounds set the upper limit of the firing temperatures needed to adequately fuse the silver metal and other inorganic materials together, and subsequently to the substrate, without inducing further thermal stress.

Thermal stress is defined herein as the force per unit area caused by the temperature difference over a small area. The relevant area is an area of a substrate to which a paste or other coating is applied and fired. The stress may be called "transient" because it is short lived, that is, it is a factor only during heating (i.e. firing) of a paste to secure adherence to a substrate. to In particular, as the substrate and conductive silver coating are heated, those portions of the substrate bearing a conventional silver coating will have a lower temperature than portions of the substrate not bearing such a coating. The temperature difference creates thermal stress.

The compositions of the invention allow relatively consistent infrared absorption over an extended firing temperature range, thus more closely matching the thermal absorption of the coating to the thermal absorption rate of the substrate, such as a high-IR absorbing black ceramic enamel, resulting in closer thermal equilibrium between the conductive silver coating and the substrate. Hence, thermal stress during the formation of such conductive coatings on substrates such as glass, enamel, ceramic, and ceramic-enamel is reduced.

The conductive silver pastes of the invention permit firing temperatures of about 950° F. up to about 1400° F., preferably about 1200° F. to about 1300° F., more preferably about 1200° F. to about 1250° F. An alternate preferred firing range is about 1300° F. to about 1400° F. It is believed that the combination of silver powders distinct morphologies and particle size distributions and silver flakes together with glass frits based on $Bi_2O_3$, $ZnO$, $SiO_2$, $B_2O_3$, $Na_2O$, $K_2O$ and $ZrO_2$ provide uniquely matched thermal expansion coefficients suitable for use with a variety of metal, glass, ceramic, and enamel substrates.

Pigments such as $CuCr_2O_4$, $(Co,Fe)(Fe,Cr)_2O_4$, and $(Fe, Co)Fe_2O_4$, as well as optional oxide-modifiers such as $MnO$, $Fe_2O_3$, $Al_2O_4$, $CuO$, and $NiO$ are used to maintain a high level of infrared absorption up to about 1400° F. This permits increased firing temperatures, and hence speeds (i.e., decreases) firing cycle times, without inducing additional thermal stress. Firing times envisioned by the invention at temperatures disclosed elsewhere herein are about 1 to about 6000 seconds, preferably about 1 to about 600 seconds, more preferably about 1 to about 300 seconds, still more preferably about 1 to about 180 seconds, more preferably about 1 to about 150 seconds, still more preferably about 60 to about 150 seconds.

The conductive pastes of the invention include several major components: silver powders, silver flakes, glass frits, pigments, pigment modifiers, organic binders and solvents. Each is detailed in turn hereinbelow.

Silver Powders and Flakes. The silver powders useful herein have a generally spherical shape. Broadly, the powders and flakes possess the properties listed in the following table. It is understood that a given powder or flake may possess any or all of the properties in a given row. Each different combination of properties for a given powder or flake constitutes a separate powder or flake that can be used and claimed in the invention. Combinations of properties for a given powder or flake from this table and others herein may be considered separate powders or flakes. Broadly, the pastes of the invention include 50-90 wt % of silver in any form. In a preferred embodiment, the pastes of the invention include 50-85 wt % silver in any faun. In a more preferred embodiment, the pastes include 50-83 wt %, and in a more preferred embodiment, the pastes include 55-80 wt % of silver in any form. Totals of subranges of different silver constituents (two powders and the flake) are understood to add up to the overall silver range even if the sum of the constituent ranges could fall under or exceed such overall silver range. Similarly, an overall composition is presumed to contain 100 wt % of total ingredients.

TABLE 1

Silver powders and flakes useful in the invention.

| Specs | Tap Density (g/ml) | Fisher Sub Sieve (μm) | Surface Area (m²/g) | PSD 95% (μm) | PSD 90% (μm) | PSD 50% (μm) | PSD 10% (μm) | Wt % |
|---|---|---|---|---|---|---|---|---|
| Powder 1 | 0.3-1.5 | 0.7-2.4 | 0.3-1.5 | <40 | <30 | 2-7 | 0.9-3.4 | 10-55 |
| Flake | 3.0-4.5 | — | 0.75-1.5 | — | <20 | 1-4 | 0.5-1.3 | 10-35 |
| Powder 2 | 2.0-4.5 | 0.7-1.5 | 0.4-1.2 | <10 | <7 | 0.5-2.5 | 0.3-1.3 | 5-30 |

TABLE 2

Preferred powder and flake properties.

| Specs | Tap Density (g/ml) | Fisher Sub Sieve (μm) | Surface Area (m²/g) | PSD 95% (μm) | PSD 90% (μm) | PSD 50% (μm) | PSD 10% (μm) | Wt % |
|---|---|---|---|---|---|---|---|---|
| Powder 1 | 0.4-1.2 | 0.85-2.1 | 0.6-1.3 | <30 | <20 | 2.5-6.5 | 0.75-3.25 | 10-55 |
| Flake | 3.2-4.2 | — | 0.85-1.35 | — | <13 | 1.3-3.0 | 0.6-1 | 10-35 |
| Powder 2 | 2.6-4.3 | 0.8-1.35 | 0.5-1 | <7 | <5 | 1-2 | 0.5-1 | 5-30 |

A wide variety of Silver Powders and Silver Flakes are commercially available from Ferro Corporation, Cleveland, Ohio. and sold under product names SPC, SFW and SFC20ED. Powder SPC20ED falls within "Powder 1" in the tables above; Powder SPC falls within "Powder 2" above, and SFW falls within "Flake" above. The abbreviation PSDxx means particle size Dxx, where xx can be 10, 50, 90 or 95. Particle size $D_{95}$ means that 95% of all particles in a sample are smaller than the listed value, in microns, similarly for $D_{90}$. Particle size $D_{50}$ is the value in microns at which 50% of the particles are larger and 50% are smaller. Particle size $D_{10}$ is a value in microns at which 10% of particles are smaller.

Ferro Corporation also sells other appropriate silver metal powders and silver metal flakes. Tap Density is a measure of the volume that a given weight of material will occupy after undergoing a certain amount of prescribed compaction as known in the art; reported as g/cc. Surface Area is determined by at least one of two techniques: permeametry by a Fisher Sub Sieve Sizer (FSSS); and gas absorption (Brunauer-Emmett-Teller method (BET)) by Quantachrome.

Glass Component. The pastes of the invention contain 1-10 wt % of a glass component, preferably 2-10 wt %, more preferably 4-10 wt % and still more preferably 5-9 wt %. The glass component may contain one or more glass frits. The glass fits useful herein are not particularly limited. However, preferred frits include oxides of at least one of zinc, and bismuth; combinations of the foregoing are also suitable. Further frit compositions may be found in Table 3. The frits useful in the invention have a CTE of 50-90×10-7, preferably 55-85×10-7 and more preferably 60-83×10-7, and are considered lower expansion frits. This is in contrast to prior art higher expansion fits which have CTEs in the range of 100-150×10-7.

TABLE 3

Glass frit compositional ranges.

| Ingredient (wt %) | Glass Composition | | |
|---|---|---|---|
| | I | II | III |
| $Bi_2O_3$ | 22-51 | 27-48 | 30-45 |
| ZnO | 2-20 | 3-18 | 5-15 |
| $SiO_2$ | 15-50 | 18-45 | 20-40 |
| $B_2O_3$ | 5-25 | 8-22 | 10-15 |
| $Na_2O + K_2O$ | 3-20 | 4-15 | 5-9 |
| F | 0.1-8 | 0.5-5 | 1-3 |
| $ZrO_2$ | 0.25-10 | 0.5-8 | 1-5 |
| $TiO_2$ | 0-7 | 0-5 | 0.1-2 |
| Li, Pb, Cd in any form | 0 | 0 | 0 |

Glass fits for various embodiments may be constructed using ranges from different columns of Table 3 or other tables. Also, for any range bounded by zero, the table is to be read as alternately disclosing the same range bounded at the lower end by 0.01 or 0.1.

Black Pigment. The compositions of the invention further include one or more inorganic black pigments (separate from carbon black, noted above). Suitable pigments herein include $CuCr_2O_4$ and $(Co,Fe)(Fe,Cr)_2O_4$ and the like. Examples include pigments available from Ferro Corporation, Washington Pa., such as 2991 pigment (copper chromite black), 2980 pigment (cobalt chromium iron black), 2987 pigment (nickel manganese iron chromium black), and O-1776 pigment (copper chromate black). In the presently most preferred embodiment of the invention, the inorganic black pigment is copper chromite spinel, available from Ferro Corporation as V-7702 or V-7709. The black pigments may be used in the paste formulation in an amount of 0.1-5 wt %, preferably 0.2-4 wt %, more preferably 0.5-3 wt % and more preferably 1-2 wt %.

Pigment Modifiers. Various oxides have been identified as useful to modify or extend the properties of the pigments disclosed hereinabove. The pastes or pigments of the invention may further include any of MnO, $Fe_2O_3$, $Al_2O_4$, CuO, and NiO.

Organic Medium. The organic medium comprises a binder and a solvent, which are selected based on the intended application. It is essential that the medium adequately suspend the particulates (i.e., metal powders, glass frit, pigment, etc.) and burn off completely upon firing. Broadly, the organic medium may include petroleum/pine oil based solvents, ester alcohol based solvents, tridecyl alcohol based solvents, thermoplastic wax based binders, and/or water miscible glycol based solvents. Simple aqueous solvents also may be used.

In particular, binders including methyl cellulose, ethyl cellulose, and hydroxypropyl cellulose, polystyrene, modified polystyrene, and combinations thereof, may be used. Suitable solvents include glycols such as ethylene glycol, propylene glycol and hexylene glycol; higher boiling alcohols such as Dowanor® (diethylene glycol monoethyl ether); butyl Carbitol® (diethylene glycol monobutyl ether); dibutyl Carbitol® (diethylene glycol dibutyl ether); butyl Carbitol® acetate (diethylene glycol monobutyl ether acetate); Texanol® (2,2,4-trimethyl-1,3-pentanediol monoisobutyrate), as well as other alcohol esters, kerosene, and dibutyl phthalate, diethylene glycol butyl ether; alpha-terpineol; beta-terpineol; gamma terpineol; tridecyl alcohol (trade name Exxal 13, for example); diethylene glycol ethyl ether (Carbitol™), diethylene glycol butyl ether (Butyl Carbitol™); pine oils, vegetable oils, mineral oils, low molecular weight petroleum fractions, tridecyl alcohols, and synthetic or natural resins and blends thereof. Products sold under the Texanol® trademark are available from Eastman Chemical Company, Kingsport, Tenn.; those sold under the Dowanol® and Carbitol® trademarks are available from Dow Chemical Co., Midland, Mich. Surfactants and/or other film forming modifiers can also be included.

Mediums including having Ferro Corporation product numbers of 1331, 1456, 1562 and 1652 and C92 may also be used. Mediums 1331 and 1356 include ethyl cellulose and tridecyl alcohol in differing amounts. Medium C92 is a combination of ethyl methacrylate, Texanol®, Exaal® 13 and Diethylene Glycol Monobutyl Ether Acetate.

TABLE 4

Formulas of Mediums useful in the Invention.

| Wt % | Ingredient/Purpose |
|---|---|
| | Medium 1356 |
| 80-90 | Tridecyl alcohol |
| 7-13 | Binder resin |
| 1-7 | Methyl ester of hydrogenated rosin |
| 0.1-4 | Dispersant |
| | Medium 1562 |
| 70-83 | Terpineol alcohol |
| 4-9 | Ester alcohol |
| 9-17 | Acrylic resin |
| 0.01-1 | Sodium dioctyl sulfosuccinate |
| 0.5-3 | Dispersant |
| | Medium C92 |
| 29-41 | 2,2,4 Trimethyl-1,3 Pentanediol Monoisobutyrate |
| 19-29 | Tridecyl alcohol |
| 14-25 | Acetate of Glycol ether DB or Acetate of butyl Carbitol |
| 10-19 | Acrylic resin binder/film former |
| 4.5-9.7 | wetting and dispersing agent |
| | Medium 1652 |
| 47-72 | Terpineol alcohol derived from pine oil |
| 28-53 | Polyterpene resin |

Dispersing Surfactant. A dispersing surfactant assists in pigment wetting, when an insoluble particulate inorganic pigment is used. A dispersing surfactant typically contains a block copolymer with pigment affinic groups. For example, surfactants sold under the Disperbyk® and Byk® trademarks by Byk Chemie of Wesel, Germany, such as Disperbyk 110, 140, and 163, which are solutions of high molecular weight block copolymers with pigment affinic groups, and a blend of solvents. Disperbyk 110 is a 1:1 blend of methoxypropylacetate and alkylbenzenes. Disperbyk 140 is a solution of alkyl-ammonium salt of an acidic polymer in a methoxypropylacetate solvent. Disperbyk 163 has the solvents xylene, butylacetate and methoxypropylacetate in a 4/2/5 ratio.

Rheological Modifier. A rheological modifier is used to adjust the viscosity of the green pigment package composition. A variety of rheological modifiers may be used, including those sold under the Byk®, Disperplast®, and Viscobyk® trademarks, available from Byk Chemie. They include, for example, the BYK 400 series, such as BYK 411 and BYK 420, (modified urea solutions); the BYK W-900 series, (pigment wetting and dispersing additives); the Disperplast series, (pigment wetting and dispersing additives for plastisols and organosols); and the Viscobyk series, (viscosity depressants for plastisols and organosols).

Examples. As set forth in Table 5, silver pastes were prepared using Ferro Corporation silver powders SPC 20ED, and SPC, and silver flakes SFW, which correspond to Powders 1 and 2 and Flake, respectively, in Tables 1 and 2. The pastes also include Glass Frits A, B C, and D, organic vehicles C-92 and 1356, P95-1W is a Cu—Cr black pigment containing a minor amount of Mn, available from Asahi Sangyo Kaisha Ltd., Tokyo, Japan, and in some cases TDA (tridecyl alcohol), Texanol®, and/or Disperbyk® 111. Frits A, B, C and D are characterized in Tables 7-10, while frit formulation advice and frit properties are given in Table 11.

TABLE 5

Exemplary paste compositions and viscosity data.

| Wt % | CCL-460-B | CCL-265-B | CCL-228 | CCL-268-B | CCL-275 | CCL-380-B |
|---|---|---|---|---|---|---|
| Overall Silver content | 60 | 69.5 | 68 | 72 | 75 | 80 |
| SPC20ED | 14.17 | 17.5 | 45.09 | 17 | 51.04 | 25 |
| SFW | 20.83 | 23.7 | 13.05 | 25 | 13.03 | 30 |
| SPC | 25 | 28.3 | | 30 | | 25 |
| SP-335 Ag powder | | | | | 11.02 | |
| SFQED | | | 10 | | | |
| Nickel SP-10 | | | 7 | | 2.98 | |
| CCL-029 | | | 0.5 | | 0.5 | |
| Frit A | 1.67 | 1.75 | | 2 | | 0.25 |
| Frit B | 1.67 | 3.25 | | 2 | | 3.5 |
| Frit C | 2.5 | 2.5 | | 3.5 | | 2 |
| Frit D | | | 8 | | 7.97 | |
| P95-1W | 1.4 | 1.5 | | 1.5 | | 1.25 |
| C 92 | 16.09 | 14.15 | | 11 | 8.38 | 9 |
| 1331 | | | 13 | | | |
| 1356 | 16.57 | 7.1 | 0.18 | 6 | 3.49 | 1.75 |
| TDA | 0.1 | | | | 2 | |
| Texanol | | 0.25 | | | 0.79 | 1.25 |
| Brij 93 | | | 0.5 | | | |
| Disperbyk111 | | | 0.5 | | 0.79 | 1 |
| Exaal 13 | | | 2.18 | | | |
| Totals | 100 | 100 | 100 | 100 | 100 | 100 |
| Viscosity Data (70° F.) | | | | | | |
| 7 spindle | cps | cps | n.m. | cps | n.m. | cps |
| 0.5 rpm | 200000 | 376000 | | 384000 | | 632000 |
| 10 | 74000 | 72400 | | 68800 | | 67200 |

TABLE 5-continued

Exemplary paste compositions and viscosity data.

| Wt % | CCL-460-B | CCL-265-B | CCL-228 | CCL-268-B | CCL-275 | CCL-380-B |
|---|---|---|---|---|---|---|
| 20 | 61600 | 55200 | | 51000 | | 44600 |
| 50 | 49600 | 39920 | | 36000 | | 29440 |
| 100 | 41600 | 29240 | | 28500 | | 27400 |

SP-335 is a silver powder having tap density 2.7 to 3.6, apparent density 23.2 to 32 grams/cubic inch, and surface area 0.75 to 1.4 m²/gram.

Yelkin® is a surface active lecithin product from Archer Daniels Midland Co, Decatur, Ill. Also, shear rate can be calculated from spindle RPMs by the equation RPM×spindle factor=shear rate. The spindle factor for the #7 spindle is 0.209. "N.M." means not measured.

TABLE 6

Successive trials based on CCL-268-B.

| Wt % | CCL-268 | 3B | 4B | 5B | 6B | 7B |
|---|---|---|---|---|---|---|
| SPC20ED | 45 | 17 | 17 | 15 | 15 | 17 |
| SFW flake | 13 | 25 | 25 | 27 | 27 | 25 |
| SPC | | 30 | 30 | 30 | 30 | 30 |
| 335 Ag powder | 10 | | | | | |
| Nickel SP-10 | 7 | | | | | |
| CCL-029 | 0.5 | | | | | |
| Frit A | | 2 | 2 | 2 | | 4 |
| Frit B | | 2 | 2.5 | 2 | | |
| Frit C | | 3.5 | 3.25 | 4 | 2 | 3.5 |
| Frit D (E-8044) | 8 | | | | | |
| FS2871 | | | | | 5.5 | |
| P95-1W | | 1.5 | | 2 | 3.5 | 1.5 |
| Ultrox | | | 1.0 | | | |
| C-92 | 13.1 | | | | | |
| 1652 | | 4 | 4 | 3.15 | 2.15 | 4 |
| 1356 | 3.4 | 6 | 6 | 5.5 | 5.5 | 6 |
| TDA | | 8.5 | 9.25 | 9.25 | 9.25 | 8.5 |
| extra TDA | 0.12 | | | | | 0.12 |
| Yelkin | | 0.05 | | 0.1 | 0.1 | 0.05 |

In the table above, Ultrox® is a zirconium silicate commercially available from Trebol USA, Andrews, S.C.

Tables 7-9. Exemplary Frit compositions. The fits useful herein are free of lithium and have the following compositional ranges. Tables 7-9 each represent one frit (Frits A, B and C), with the columns representing broad, preferred and more preferred ranges for each fit. Frit A corresponds to commercially available Ferro product E-8008, while Frits B and C correspond, respectively, to Ferro Corporation products E-8018 and E-8027. Frit D corresponds to Ferro Corporation frit E-8044. E-8018 may be termed a low expansion frit, while E-8027 is an ultra low expansion frit.

TABLE 7

Exemplary formulation ranges for Frit A.

| Oxides | Broad | Preferred | More Preferred |
|---|---|---|---|
| Bi2O3 | 37-51 | 38.5-49.2 | 41.1-47.8 |
| ZnO | 11-21 | 12.2-19.8 | 13.4-18.7 |
| SiO2 | 12-25 | 14.3-23.2 | 16.9-21.7 |
| B2O2 | 7.2-16.7 | 8.4-14.8 | 9.1-13.2 |
| Na2O | 1.7-7.7 | 2.5-6.1 | 3.1-5.9 |

TABLE 7-continued

Exemplary formulation ranges for Frit A.

| Oxides | Broad | Preferred | More Preferred |
|---|---|---|---|
| F | 0.9-3.4 | 1.3-3.1 | 1.7-2.8 |
| ZrO2 | 0.7-2.1 | 0.9-1.8 | 1.1-1.7 |
| TiO2 | 0.8-2.4 | 1.1-2.2 | 1.3-1.8 |
| totals | 100 | 100 | 100 |

TABLE 8

Exemplary formulation ranges for Frit B.

| Oxides | Broad | Preferred | More Preferred |
|---|---|---|---|
| Bi2O3 | 37.2-51.1 | 39.3-47.8 | 41.4-46-6 |
| ZnO | 1.7-5.1 | 2.2-4.8 | 2.5-4.3 |
| SiO2 | 28.7-33.6 | 29.3-32.8 | 29.9-31.7 |
| B2O2 | 11.9-17.2 | 12.7-16.8 | 13.2-15.7 |
| Na2O | 4.7-9.1 | 5.2-8.2 | 5.9-7.5 |
| F | 0 | 0 | 0 |
| ZrO2 | 0.7-2.4 | 0.9-2.1 | 1.1-1.8 |
| TiO2 | 0 | 0 | 0 |
| totals | 100 | 100 | 100 |

TABLE 9

Exemplary formulation ranges for Frit C.

| Oxides | Broad | Preferred | More Preferred |
|---|---|---|---|
| $Bi_2O_3$ | 26.2-33.1 | 27.5-32.2 | 28.2-30.9 |
| ZnO | 2.1-8.8 | 3.0-6.9 | 3.4-5.8 |
| $SiO_2$ | 38.5-43.2 | 39.2-42.2 | 39.7-41.8 |
| $B_2O_3$ | 11.2-15.7 | 12.3-15.1 | 13.1-14.4 |
| $Na_2O$ | 3.9-8.7 | 4.4-7.9 | 5.1-7.4 |
| F | 0 | 0 | 0 |
| ZrO2 | 2.7-8.1 | 3.2-7.1 | 3.9-6.4 |
| TiO2 | 0 | 0 | 0 |
| totals | 100 | 100 | 100 |

TABLE 10

Exemplary formulation ranges for Frit D.

| Oxides | Broad | Preferred | More Preferred |
|---|---|---|---|
| Bi2O3 | 48.2-56.9 | 49.1-55.3 | 50.4-54.1 |
| ZnO | 5.9-10.2 | 6.8-9.7 | 7.4-9.1 |
| SiO2 | 21.6-30.3 | 23.2-28.5 | 24.4-27.2 |
| $B_2O_3$ | 5.8-11.3 | 6.4-10.2 | 6.9-9.4 |
| $Li_2O$ | 0.7-4.4 | 1.2-3.9 | 1.6-2.8 |
| Na2O | 1.1-4.9 | 1.6-4.1 | 2.2-3.4 |
| $K_2O$ | 0.4-2.8 | 0.6-2.2 | 0.8-1.7 |

TABLE 10-continued

Exemplary formulation ranges for Frit D.

| Oxides | Broad | Preferred | More Preferred |
|---|---|---|---|
| F | 0.1-2.2 | 0.2-1.7 | 0.3-1.1 |
| ZrO2 | 0.1-2.7 | 0.2-2.1 | 0.3-1.4 |
| TiO2 | 0.3-3.1 | 0.5-2.4 | 0.6-1.7 |
| totals | 100 | 100 | 100 |

TABLE 11

Properties of Frits A-D from formulations in Table 4.

| Frits | % range | CTE of frit | minimum fire |
|---|---|---|---|
| Frit A | 0.25-2.5% | 80 × 10−7 | 1110° F. |
| Frit B | 1.5-3.5% | 83 × 10−7 | 1090 |
| Frit C | 2.0-3.75% | 65 × 10−7 | 1170 |
| Frit D | Not measured | 87 × 10−7 | Not measured |

In the above table, minimum fire is the lowest temperature where the frit will fuse and form a non-porous coating.

TABLE 12

Summary of Percentage Strength Reduction of PPG and Guardian glass plates when printed and fired with Inventive Frits.

| Group | Firing Temperature (° F.) Screen Printed | *Percentage Strength Reduction Based on Averaged Total Calculated Stress to Cause Failure (psi) | | *Averaged Percentage Strength Reduction Based on Averaged Tension Stress from the Mirror Radius (psi) | |
|---|---|---|---|---|---|
| | | Air Surface | Tin Surface | Air Surface | Tin Surface |
| Control | 1220 | 68 | 69 | 69 | 71.5 |
| Control | 1235 | 70 | NA | 75 | NA |
| w/o Nickel w/Lithium | 1220 | NA | 65 | NA | 71.5 |
| w/o Nickel, with Frit B | 1220 | NA | 60 | NA | 66 |

In Table 12, Control is a state of the art paste that contains lithium and does not contain low expansion frits.

In Table 13 that follows, several examples of inventive and prior art pastes are applied to commercially available glass plates (from PPG or Guardian) and fired at a temperature at a time indicated.

TABLE 13

Properties of Silver pastes fired on Glass plates.

| Glass Plate Supplier | CCL-268 Group ID, Enamel, or Combo | Firing Temperature (° F.) Time (Minutes) | Averaged Tension Stress from Mirror Radius (Psi) | *Averaged Percentage Glass Strength Reduction Based on Averaged Tension Stress from Mirror Radius (Psi) |
|---|---|---|---|---|
| PPG | Control | N/A | 24,390 | N/A |
| PPG | JMatthey 2T1730 (no Ag) | 1226/1:50 | 11,250 | 54 |
| PPG | CCL-268 | 1221/2:00 | 3,962 | 84 |
| PPG | CCL-268 overprinted with JM 2T1730 | 1222/2:28 | 2,470 | 89 |
| PPG | CCL-268 no Nickel; w/ E-8018 | 1221/1:55 | 3,980 | 84 |
| PPG | CCL-268-3B no nickel with black pigment Low "E" silver and E-8027 | 1221/2:23 | 7,620 | 69 |
| PPG | CCL-268-4B no Ni with additive to lower expansion and E-8027 | 1231/2:31 | 4,900 | 80 |
| PPG | CCL-268-5B no nickel with E-8018 with black pigment) | 1221/2:21 | 5,900 | 76 |
| PPG | CCL-268-6B no nickel with E-8018 and black pigment | 1221/2:21 | 5,900 | 76 |
| Guardian | Control | N/A | 21,970 | N/A |
| Guardian | JMatthey 2T1730 | 1226/1:50 | 11,030 | 50 |
| Guardian | CCL-268 | 1221/2:00 | 3,046 | 86 |
| Guardian | Ferro CCL-268 + silver overprinted with Johnson Matthey 2T1730 | 1222/2:28 | 2,400 | 89 |

TABLE 13-continued

Properties of Silver pastes fired on Glass plates.

| Glass Plate Supplier | CCL-268 Group ID, Enamel, or Combo | Firing Temperature (° F.) Time (Minutes) | Averaged Tension Stress from Mirror Radius (Psi) | *Averaged Percentage Glass Strength Reduction Based on Averaged Tension Stress from Mirror Radius (Psi) |
|---|---|---|---|---|
| Guardian | CCL-268 no Nickel/ with E-8018 | 1221/1:55 | 4,710 | 79 |
| Guardian | CCL-268-3B no nickel with black pigment Low "E" silver and E-8027 | 1221/2:23 | 6,640 | 70 |
| Guardian | CCL-268-4B no nickel with additive to lower expansion and E-8027 | 1231/2:31 | 5,220 | 76 |
| Guardian | CCL-268-5B no nickel E-8018 and black pigment | 1221/2:07 | 5,270 | 76 |
| Guardian | CCL-268-6B no nickel with E-8018 and black pigment | 1221/2:07 | 4,870 | 78 |
| Guardian | Clear Inboard Ply "Control" Samples removed from sections above bottom grid/ enamel band area. | Exit Temp 1220-1225° C. | 23,370 | N/A |
| Guardian | Samples removed bottom sections of Ag grid/enamel band area (Ferro CCL-268 silver overprinted with JMatthey 2T1730 enamel) | Exit Temp 1220-1225° C. | 5,640 | 76 |

Low expansion frit is E8018, and extra low expansion frit is E-8027.

In the table above, Control means that the glass print is fired with no silver and no black enamel. JM 2T1730 is Johnson Matthey black enamel and the corresponding sample is a test with the black enamel only and no silver printed on glass.

CCL-268 (68% Ag) sampled from a production lot retain showed averaged 72% percent of glass strength (similar to CCL-228). CCL-268B (72% Ag) lab sample averaged 49% percent glass strength decrease with an averaged basic strength of 4010 psi tension that exceeded the glass/silver basic strength range of 1880 to 2820 psi tension. Ferro CCL-268B (nickel-free) silver paste sampled from production lots exhibited identical glass strength reduction of 60%. The average basic strength values for these two groups averaged 3032 psi tension that exceeded the glass/silver basic strength range of 1880 to 2820 psi tension.

CCL-380 (80% Ag) sampled from a production lot retain averaged 77% percent glass strength decrease. CCL-380B (80% Ag lab sample dated 6-20-2013 averaged 68% percent glass strength decrease with a basic strength of 2413 psi tension that is within the glass/silver basic strength range of 1880 to 2820 psi tension.

Both the Ferro CCL-380B (nickel free) lab sample and the CCL-380 nickel version silver paste averaged approximate strength reductions of 76%. The lab sample exhibited a basic strength of 1793 which is below the glass/silver basic strength range of 1880 to 2820 psi tension.

TABLE 14

Ferro Silver pastes with or without Nickel, Fired on PPG or Guardian Glass Plates.

| Glass Plate Supplier | Glass Type | Glass Thickness (mm) | Paste Supplier | Silver Paste Group ID, Enamel, or Combo | Silver % | Firing Temp (° F.)/Time (Min) | Glass Surface Tested | Averaged Tension Stress from Mirror Radius (Psi) | Averaged Percentage Glass Strength Reduction Based on Averaged Tension Stress from Mirror Radius (Psi) |
|---|---|---|---|---|---|---|---|---|---|
| PPG/PGW | Clear | 1.6 | Ferro | CCL-268 | 68 | 1221/2:00 | Air | 3,962 | 84 |
| PPG/PGW | Clear | 1.6 | Ferro | CCL-268-3B | 72 | 1221/2:23 | Air | 7,620 | 69 |
| Guardian | Clear | 1.6 | Ferro | CCL-268 | 68 | 1221/2:00 | Air | 3,046 | 86 |
| Guardian | Clear | 1.6 | Ferro | CCL-268-3B | 72 | 1221/2:23 | Air | 6,640 | 70 |
| PPG/PGW | Solex | 2.1 | Ferro | CCL-268 | 68 | 1220/3:25 | Tin | 5,110 | 72 |
| PPG/PGW | Solex | 2.1 | Ferro | CCL-268-3B | 72 | 1221 ~3:00 | Tin | 9,340 | 49 |
| PPG/PGW | Solex | 2.1 | Ferro | CCL-228 w/Ni | 68 | 1221 ~3:00 | Tin | 5,370 | 70.5 |
| PPG/PGW | Solex | 2.1 | Ferro | CCL-228B no Ni | TBD | 1220 in 3:07 | Tin | 5,900 | 68 |
| PPG/PGW | Solex | 2.1 mm | Ferro | CCL-275 w/Ni | 75 | 1,220 in 3:00 | Tin | 4,390 | 76 |
| PPG/PGW | Solex | 2.1 mm | Ferro | CCL-275B no Ni with E-8027 | 76 | 1,220/3:25 | Tin | 4,400 | 76 |
| PPG/PGW | Solex | 2.1 mm | Ferro | CCL-380 w/Ni | 80 | 1,220/3:25 | Tin | 4,159 | 77 |

In the table above, "air" means that the silver was printed on the air surface of the molten float glass, while "tin" means the silver was printed on the tin surface of the glass.

Additional advantages and modifications will readily occur to those skilled in the art. Therefore, the invention in its broader aspects is not limited to the specific details and illustrative example shown and described herein. Accordingly, various modifications may be made without departing from the spirit or scope of the general invention concept as defined by the appended claims and their equivalents.

The invention claimed is:

1. A lithium-free conductive paste comprising:
   a. 50-90 wt % of a silver component, comprising
      i. 10-55 wt % of a first silver powder having a tap density of 0.3-1.5 g/cc,
      ii. 10-35 wt % of a silver flake having a tap density of 3.0-4.5 g/cc, and
      iii. 5-30 wt % of a second silver powder having a tap density of 2.0-4.5 g/cc,
   b. 2-10 wt % of a glass component, comprising
      i. 25-50 wt % $Bi_2O_3$,
      ii. 2-15 wt % ZnO,
      iii. 15-45 wt % $SiO_2$,
      iv. 5-20 wt % $B_2O_3$,
      v. 1-10 wt % $Na_2O+K_2O$ and
      vi. 0.1-10 wt % $ZrO_2$
   c. 0.1-5 wt % of a pigment selected from the group consisting of
      i. $CuCr_2O_4$,
      ii. $(Co,Fe)(Fe,Cr)_2O_4$, and
      iii. $(Fe,Co)Fe_2O_4$, and
   d. no lithium.

2. The conductive paste of claim 1, wherein the first silver powder has a particle size $D_{50}$ of 2-7 microns.

3. The conductive paste of claim 2, wherein the first silver powder has a particle size $D_{50}$ of 2.5-6.5 microns.

4. The conductive paste of claim 2, wherein the second silver powder has a particle size $D_{50}$ of 0.5-2.5 microns.

5. The conductive paste of claim 4, wherein the second silver powder has a particle size $D_{50}$ of 1-2 microns.

6. The conductive paste of claim 4, wherein the silver flake has a particle size $D_{50}$ of 1-4 microns.

7. The conductive paste of claim 6, wherein the silver flake has a particle size $D_{50}$ of 1.3-3.3 microns.

8. The conductive paste of claim 6, wherein the silver flake has a specific surface area of 0.75-1.5 $m^2/g$.

9. The conductive paste of claim 8, wherein the silver flake has a specific surface area of 0.85-1.35 $m^2/g$.

10. The conductive paste of claim 4, wherein the second silver powder has a specific surface area of 0.25-1.25 $m^2/g$.

11. The conductive paste of claim 10, wherein the second silver powder has a specific surface area of 0.5-1 $m^2/g$.

12. The conductive paste of claim 2, wherein the first silver powder has a specific surface area of 0.5-1.5 $m^2/g$.

13. The conductive paste of claim 12, wherein the first silver powder has a specific surface area of 0.6-1.3 $m^2/g$.

14. The conductive paste of claim 1, wherein the pigment further comprises at least one selected from the group consisting of MnO, $Fe_2O_3$, $Al_2O_4$, CuO, and NiO.

15. The conductive paste of claim 1, wherein the paste comprises:
   a. 55-85 wt % of a silver component, comprising
      i. 15-50 wt % silver powder having a tap density of 0.4-1.2 g/cc and a particle size $D_{50}$ of 2.5-6.5 microns,
      ii. 15-30 wt % of a silver flake having a tap density of 3.2-4.2 g/cc and a particle size $D_{50}$ of 1.3-3.3 microns, and
      iii. 10-28 wt % of a silver powder having a tap density of 2.6-4.3 g/cc and a particle size $D_{50}$ of 1-2 microns,
   b. 3-8 wt % of a glass component, comprising
      i. 25-50 wt % $Bi_2O_3$,
      ii. 2-15 wt % ZnO,
      iii. 15-45 wt % $SiO_2$,
      iv. 5-20 wt % $B_2O_3$,
      v. 1-10 wt % $Na_2O+K_2O$ and
      vi. 0.1-10 wt % $ZrO_2$
   c. 1-2 wt % of a pigment selected from the group consisting of
      i. $CuCr_2O_4$,
      ii. $(Co,Fe)(Fe,Cr)_2O_4$, and
      iii. $(Fe,Co)Fe_2O_4$, and
   d. no lithium.

16. A substrate at least partially covered with a fired paste, wherein the paste is the conductive paste of claim 1.

17. A method of reducing transient thermal stresses between a coating and a substrate during firing, the method comprising:
   a. applying to the substrate a lithium-free conductive paste, the paste comprising:
      i. 50-90 wt % of a silver component, comprising:
         1. 10-55 wt % of a first silver powder having a tap density of 0.3-1.5 g/cc,
         2. 10-35 wt % of a silver flake having a tap density of 3.0-4.5 g/cc, and
         3. 5-30 wt % of a second silver powder having a tap density of 2.0-4.5 g/cc,
      ii. 2-10 wt % of a glass component, comprising:
         1. 25-50 wt % $Bi_2O_3$,
         2. 2-15 wt % ZnO,
         3. 15-45 wt % $SiO_2$,
         4. 5-20 wt % $B_2O_3$,
         5. 1-10 wt % $Na_2O+K_2O$ and
         6. 0.1-10 wt % $ZrO_2$
      iii. 0.1-5 wt % of a pigment selected from the group consisting of
         1. $CuCr_2O_4$,
         2. $(Co,Fe)(Fe,Cr)_2O_4$, and
         3. $(Fe,Co)Fe_2O_4$, and
      iv. no lithium, and
   b. firing the paste at a firing temperature and time sufficient to sinter the silver metal and fuse the glass component.

18. The method of claim 17 wherein the firing temperature is about 950° F. to about 1400° F.

19. The method of claim 17 wherein the firing temperature is about 1200° F. to about 1300° F.

20. The method of claim 17 wherein the firing time is about 1 to about 300 seconds.

* * * * *